US006617232B2

(12) United States Patent
Kim et al.

(10) Patent No.: US 6,617,232 B2
(45) Date of Patent: Sep. 9, 2003

(54) METHOD OF FORMING WIRING USING A DUAL DAMASCENE PROCESS

(75) Inventors: Il-Goo Kim, Seongnam-si (KR); Jae-Seung Hwang, Suwon-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/190,478

(22) Filed: Jul. 9, 2002

(65) Prior Publication Data

US 2003/0013316 A1 Jan. 16, 2003

(30) Foreign Application Priority Data

Jul. 12, 2001  (KR) .................... 2001-0041940

(51) Int. Cl.[7] .............................................. H01L 21/44
(52) U.S. Cl. .................. 438/597; 438/618; 438/637; 438/639; 438/687; 438/696; 438/700
(58) Field of Search ................................ 438/597, 618, 438/622, 637, 639, 687, 696, 700

(56) References Cited

U.S. PATENT DOCUMENTS 6,204,096 B1    3/2001  Lai et al. .................... 438/128
6,211,092 B1    4/2001  Tang et al.
6,284,664 B1 *  9/2001  Kawai ......................... 438/710
2001/0000246 A1 4/2001  Tang et al.
2001/0006850 A1 7/2001  Park et al.
2002/0039843 A1 * 4/2002  Ikeda et al. .................. 438/738

* cited by examiner

Primary Examiner—Richard Elms
Assistant Examiner—Beth E. Owens
(74) Attorney, Agent, or Firm—Lee & Sterba, P.A.

(57) ABSTRACT

A method of forming electric wiring using a dual damascene process wherein prevention of damage to a lower conductive pattern and low contact resistance may be achieved. A first insulation layer having a first trench filled with a conductive material is formed on a semiconductor substrate. A first etch stop layer, a second insulation layer and a third insulation layer are sequentially formed thereon. A capping layer is formed on the third insulation layer. A via hole is formed by selectively etching the capping layer, third insulation layer and second insulation layer. Then the capping layer is partially etched and a polymer layer is formed on the exposed first etch stop layer. A second trench is formed and the electric wiring is formed by filling a conductive material in a resulting structure. The polymer layer prevents damage to the conductive pattern by protecting the first etch stop layer.

23 Claims, 10 Drawing Sheets

METHOD OF FORMING WIRING USING A DUAL DAMASCENE PROCESS

BACKGROUND OF THE INVENTION

1. Field of the Invention

The present invention relates to a method of forming electric wiring in a semiconductor device. More particularly, the present invention relates to a method of forming electric wiring using a dual damascene process in which contacts and conductive lines may be formed simultaneously.

2. Description of the Related Art

Great strides are being made in semiconductor technology as the use of information media, such as computers, continues to increase. To be functionally efficient, semiconductor devices should be operated at a high speed and have a large storage capacity. Accordingly, semiconductor manufacturing technologies are continually being developed to improve the integration degree, reliability and response time of semiconductor devices. One semiconductor technology in particular, a process for forming electric wiring in a semiconductor device, is subject to strict requirements.

Aluminum, which has a low contact resistance that facilitates the electric wiring process, has conventionally been used to form electric wiring in semiconductor devices. If used in highly integrated semiconductor devices, however, aluminum wiring structures may cause various problems, such as a junction spike failure and electromigration. Additionally, a material having a lower resistance than that of aluminum is preferable in order to improve the response speed of the semiconductor device.

Consequently, copper, having a lower resistance and superior electromigration characteristics, is often used together with a low dielectric insulation layer in order to form electric wiring. Copper is rapidly dispersed in silicon and various metal layers, however, so copper has not been adapted for a conventional photolithography process. For this reason, a damascene process is used for forming electric wiring with copper. When forming electric wiring using the damascene process, a dual damascene process wherein conductive lines and contacts may be formed simultaneously, is preferably used for economical reasons.

The dual damascene structure has a via hole where a contact connected to a lower conductor is formed and a trench where a conductive line is formed. The dual damascene structure is achieved by performing one of following etching processes. In a first etching process, the trench is formed after forming the via hole (via-first-forming method). In a second etching process, the via hole is formed after forming the trench (trench-first-forming method). In the third etching process, the via hole and the trench are simultaneously formed (buried-trench-forming method).

The above processes are discriminated from each other by the order in which the via hole and trench are formed in the photolithography and etching processes. The process may be properly selected according to the size of the trench and via hole, the misalign degree of the trench and via hole, etc.

Among the above processes, the via-first-forming method is primarily used because it can simplify the dual damascene structure and reduce misalignment of the trench and via hole.

FIGS. 1A to 1D illustrate sectional views showing a conventional method of forming an electric wiring using a dual damascene process.

Referring to FIG. 1A, a first insulation layer 10, having a via hole or a trench filled with conductive material, is formed on a semiconductor substrate (not shown). Accordingly, an upper surface of a conductive pattern 10a formed by the conductive material filling the via hole or the trench is exposed at a predetermined portion of an upper surface of the first insulation layer 10.

Then, an etch stop layer 12 is formed on the first insulation layer 10. A second insulation layer 14 and a third insulation layer 16 are sequentially formed on the etch stop layer 12. The third insulation layer 16 is formed of a material having a lower dielectric constant than that of the second insulation layer 14, and generally has a dielectric constant (k) below 3.5.

Via holes for connecting conductors to each other are formed in the second insulation layer 14 by the next process. The second insulation layer 14 insulates the via holes from each other. In addition, trenches for forming upper conductive lines are formed in the third insulation layer 16. The third insulation layer 16 insulates the upper conductive lines from each other. Accordingly, the third insulation layer 16 includes a low dielectric material for preventing an increase in capacitance between adjacent upper conductive lines. Generally, the third insulation layer 16 includes carbon or a carbon compound, which is a low dielectric material.

Referring to FIG. 1B, a via hole 18 is formed by etching predetermined portions of the third and second insulation layers 16a and 14a, such that a predetermined portion of the etch stop layer 12 positioned on the conductive pattern 10a of the first insulation layer 10 may be exposed. Therefore, the conductive pattern 10a is positioned below a bottom of the etch stop layer 12 which is exposed at a lower portion of the via hole 18.

Referring to FIG. 1C, a linear trench 20 partially overlapping the via hole 18 is formed by etching a predetermined portion of the third insulation layer 16b. The trench 20 includes the via hole 18 and is formed wider than the via hole 18. At the trench 20, the upper conductive line is formed by the next process.

In order to etch the third insulation layer 16b including carbon or a carbon compound, a plasma etching process is carried out using $C_xF_y$ gas together with mixing gas including oxygen gas and nitrogen gas. Etching gas for etching the third insulation layer 16b has a low etching selectivity with respect to the etch stop layer 12a. For this reason, when etching the third insulation layer 16b, the etch stop layer 12a exposed at the lower portion of the via hole 18b is etched simultaneously.

If the upper portion of the conductive pattern 10a positioned below the etch stop layer 12a is exposed due to the etching of the etch stop layer 12a, high energy plasma collides with the upper surface of the exposed conductive pattern 10a. As a result, a lower portion of the conductive pattern 10a, where the contact is to be formed, may be damaged.

Referring to FIG. 1D, a conductive material 22 is used to fill the via hole and trench 20 after removing the etch stop layer 12a remaining in the lower portion of the via hole 18b. Then, a polishing process is carried out such that the conductive material 22 remains only in the via hole 18b and the trench 20, thereby forming the electric wiring.

When forming the electric wiring according to the above-mentioned conventional process, the etch stop layer 12a formed at the lower portion of the via hole 18b may be etched when etching the trench 20 for forming the conductive line, so that the lower conductive pattern 10a becomes damaged. For this reason, it is difficult to achieve a contact having a low resistance.

To solve the problems described above, there has been suggested a method for etching a trench after forming an anti-reflection layer consisting of an organic material in a state that a via hole has been formed. However, in accordance with the method described above, a portion of the third insulation layer to be etched is frequently not etched, thereby causing failure of the semiconductor device.

In addition, the prior art discloses a method of forming a trench in which a spin-on-glass layer is formed after forming a via hole. Then, after forming the trench by etching the third insulation layer, the spin-on-glass layer is removed. However, although using the spin-on-glass layer when etching the trench in this method may protect the lower layer, it is difficult to remove the spin-on-glass layer in a subsequent process. In addition, since the etch stop layer indicating an end point of the etch is not provided when the via hole is formed, a lower conductive pattern may be damaged by the plasma.

SUMMARY OF THE INVENTION

The present invention has been made to overcome the deficiencies of the prior art as described above. Therefore, it is a feature of an embodiment of the present invention to provide a method of forming electric wiring using a dual damascene process such that damage to a lower conductive pattern may be prevented and a low contact resistance may be achieved.

To provide this and other features of the present invention, a method of forming a wiring of a semiconductor device is provided, including: forming a first insulation layer having a hole or a first trench filled with a conductive material on a semiconductor substrate; sequentially forming a first etch stop layer including a non-oxide based insulating material having carbon or a carbon compound and a second insulation layer including an oxide based insulating material on the first insulation layer; forming a third insulation layer including the oxide based insulating material on the second insulation layer; forming a capping layer including a non-carbonic oxide based insulating material on the third insulation layer; forming a via hole by etching predetermined portions of the capping layer, the third insulation layer and the second insulation layer in such a manner that a part of the first etch stop layer corresponding to an upper portion of the hole or the trench filled with conductive material is exposed; forming a photoresist pattern on the capping layer having the via hole so as to form a linear trench including the via hole; partially etching the capping layer using the photoresist pattern as an etching mask, the capping layer being reacted with an etching gas used for etching the capping layer to form a polymer layer on the first etch stop layer for protecting the first etch stop layer; forming a second trench by sequentially etching the remaining capping layer and the third insulation layer using the photoresist pattern as an etching mask; removing the photoresist pattern and the polymer layer; removing the first etch stop layer exposed at a lower portion of the via hole; and filling a resulting structure with a conductive material.

According to the method of the present invention, when the capping layer is partially etched, polymer is sufficiently formed on the first etch stop layer by being reacted with the etching gas used for etching the capping layer. When the second trench is etched, the first etch stop layer cannot be etched together with the second trench due to the presence of the polymer, so damage to the lower conductive pattern is prevented.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Korean Patent Application No. 2001-41940, filed on Jul. 12, 2001, and entitled: "Method of Forming Wiring by Using Dual Damascene Process," is incorporated herein by reference in its entirety.

Hereinafter, a preferred embodiment of the present invention will be described in detail with reference to the accompanying drawings.

FIGS. 2A to 2K illustrate sectional views showing a method of forming an electric wiring using a dual damascene process according to an embodiment of the present invention.

Figure 1A:
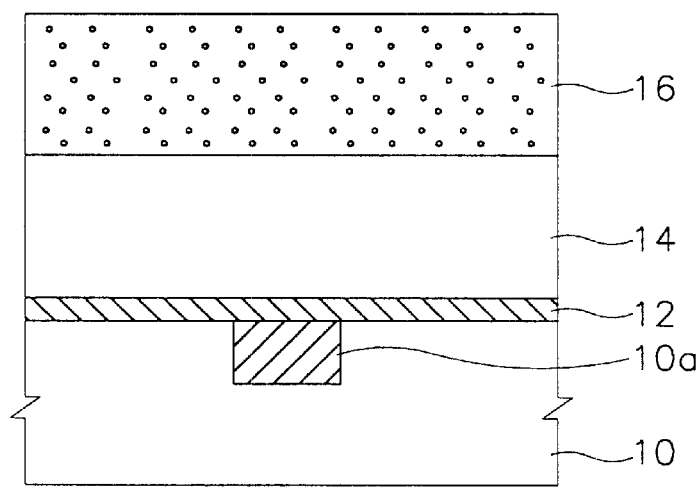
FIGS. 1A to 1D illustrate sectional views showing a method of forming an electric wiring using a conventional dual damascene process.
Figure 1B:
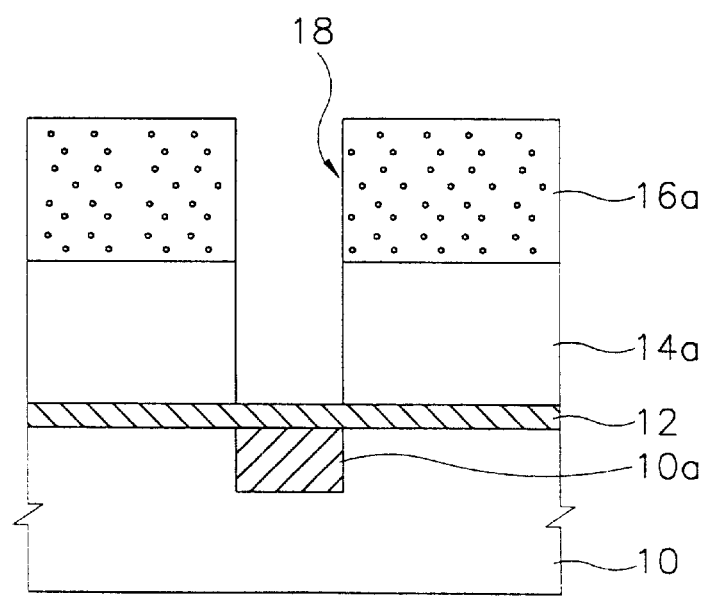
Figure 1C:
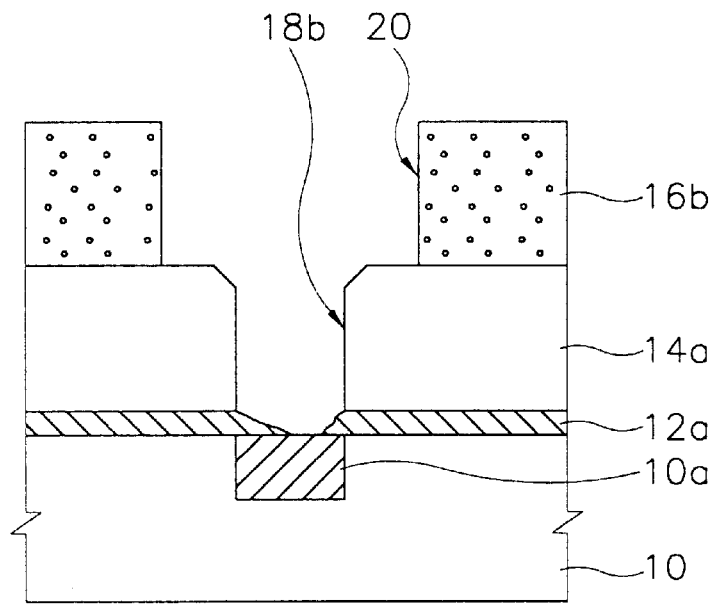
Figure 1D:
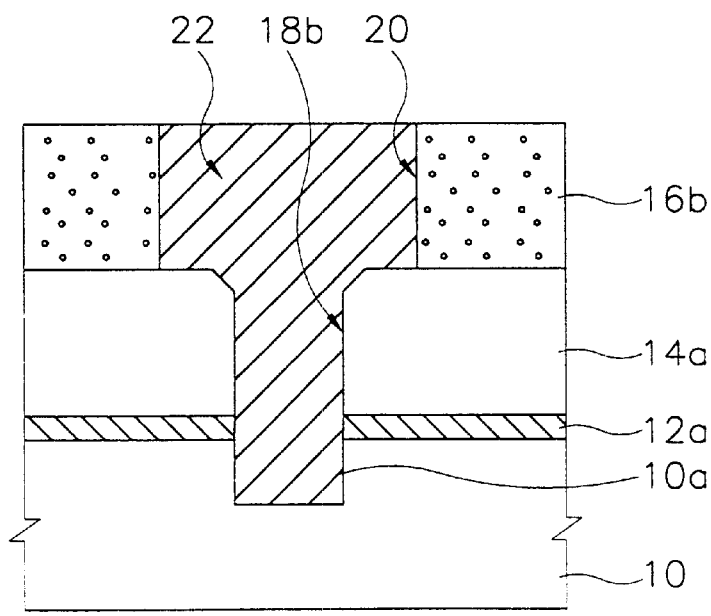
Figure 2A:
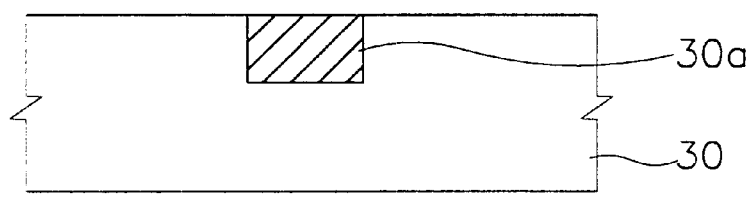
FIGS. 2A to 2K illustrate sectional views showing a method of forming an electric wiring using a dual damascene process according to an embodiment of the present invention.

Referring to FIG. 2A, a first insulation layer 30 having a hole or a trench filled with a conductive material is formed on a semiconductor substrate (not shown). More particularly, an upper surface of a conductive pattern 30a including the conductive material filling the hole or the trench is exposed at a predetermined portion of an upper surface of the first insulation layer 30.

Specifically, after forming an insulation layer on the semiconductor substrate by depositing an insulating material, such as silicon oxide, the hole or trench is formed on a predetermined portion of the insulation layer where the conductive pattern is to be formed. Then, a conductive material, such as doped polysilicon, is used to fill the hole or trench. Thereafter, an etch back process or a chemical mechanical polishing (CMP) process is carried out to etch the conductive material, thereby forming the first insulation layer 30, in which the conductive pattern 30a is exposed at the upper surface of the first insulation layer 30.

Alternatively, the conductive pattern 30a may be formed by depositing and patterning the conductive material on the semiconductor substrate formed with the insulation layer. Next, an insulation layer is formed on the conductive pattern 30a. Then, an etch back process or a CMP process is carried out to etch back the insulation layer, thereby forming the first insulation layer 30 having the conductive pattern 30a exposed at an upper surface thereof.

Figure 2B:
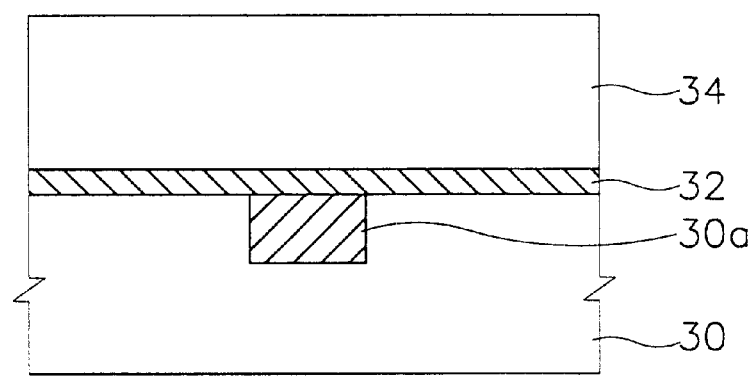

Referring to FIG. 2B, a first etch stop layer 32 and a second insulation layer 34 are sequentially formed on the first insulation layer 30.

The first etch stop layer 32 indicates an end point of an etch when the layers are etched in subsequent processes and protects the conductive pattern 30a positioned below a bottom of the first etch stop layer 32. Accordingly, the first etch stop layer 32 includes a material having an etching selectivity that is remarkably different from an etching selectivity of the second insulation layer 34 formed on the first etch stop layer 32. The etching selectivities of the first etch stop layer 32 and the second insulation layer 34 are such that an etch rate of the first etch stop layer 32 is remarkably lower than an etch rate of the second insulation layer 34. Here, the second insulation layer 34 preferably includes an oxide based insulating material, such as silicon oxide.

Therefore, the first etch stop layer 32 includes a non-oxide based insulating material having carbon (C) or a carbon compound, such as an SiC layer, for example.

Figure 2C:
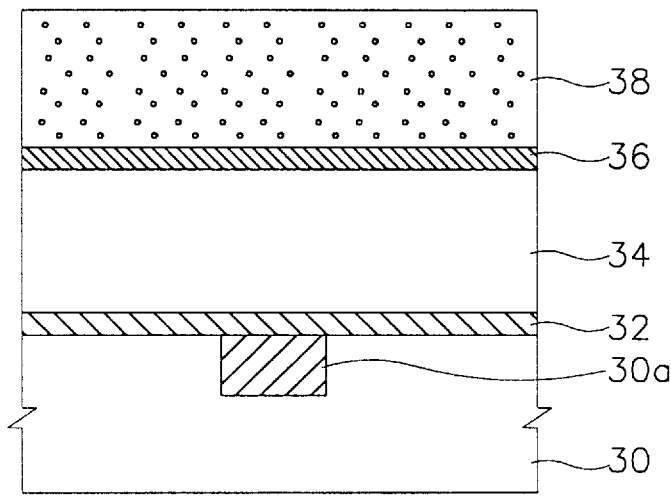

Referring to FIG. 2C, a second etch stop layer 36 and a third insulation layer 38 are sequentially formed on the second insulation layer 34.

Trenches for forming an upper conductive line are formed in the third insulation layer 38 at a predetermined portion through a subsequent etching process, and are insulated from each other by the third insulation layer 38. The second etch stop layer 36 indicates the end point of an etching process so that the etching process may be precisely carried out when etching the third insulation layer 38 for forming the trenches.

The second etch stop layer 36 preferably includes an SiN layer or a non-oxide based layer including carbon or a carbon compound, for example an SiC layer. However, the second etch stop layer 36 may be omitted for simplification.

The third insulation layer 38 includes an oxide based insulating material preferably including a low dielectric material.

As mentioned above, the third insulation layer 38 insulates conductive lines from each other. Since the conductive lines are closely adjacent to each other, a parasitic capacitance in the form of conductive line/third insulation layer/conductive line is formed between the conductive lines. It is such a parasitic capacitance that is responsible for the RC delay of semiconductor devices. Therefore, the parasitic capacitance should be reduced in order to improve the response time and reliability of the semiconductor device.

For this reason, the third insulation layer 38 includes an oxide based insulating material preferably including a low dielectric material to lower a dielectric constant (k) thereof and reduce the capacitance. The third insulation layer 38 preferably includes a material having a dielectric constant (k) below about 3.5. Particularly, the third insulation layer 38 is preferably formed using a low dielectric material such as carbon-doped or carbon compound-doped oxide, hydrogen silsesquioxane (HSQ), or methyl silsesquioxane (MSQ). That is, the third insulation layer 38 may include an SiOC, SiOH, or SiOCH$_3$ based material.

Figure 2D:
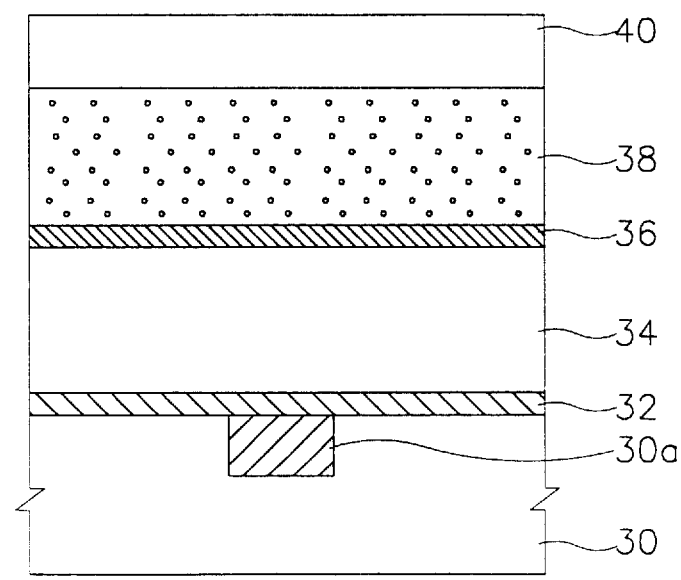

Referring to FIG. 2D, a capping layer 40 including a non-carbonic oxide based insulating material, from which carbon or a carbon compound is omitted, is formed on the third insulation layer 38.

For example, the capping layer 40 is formed using an undoped oxide layer such as an SiO$_2$ layer, a TEOS (tetraethyl orthosilicate) layer, a PEOX (plasma-enhanced oxide) layer, a USG (undoped silicate glass) layer, or a BPSG (borophosphorous silicate glass) layer, or using an oxide layer doped with a non-carbonic material, such as an SiOF layer.

The capping layer 40 includes an oxide based insulating material in which carbon or a carbon compound is not included. Therefore, the etching selectivity of the capping layer 40 may be adjusted with respect to the etching selectivity of the first etch stop layer 32, which includes the non-oxide based insulation layer having carbon or a carbon compound, by selectively using an etching gas. Specifically, it is possible to etch only the capping layer 40 while the first etch stop layer 32 is barely etched by selecting an etching gas that does not etch carbon or a carbon compound.

Figure 2E:
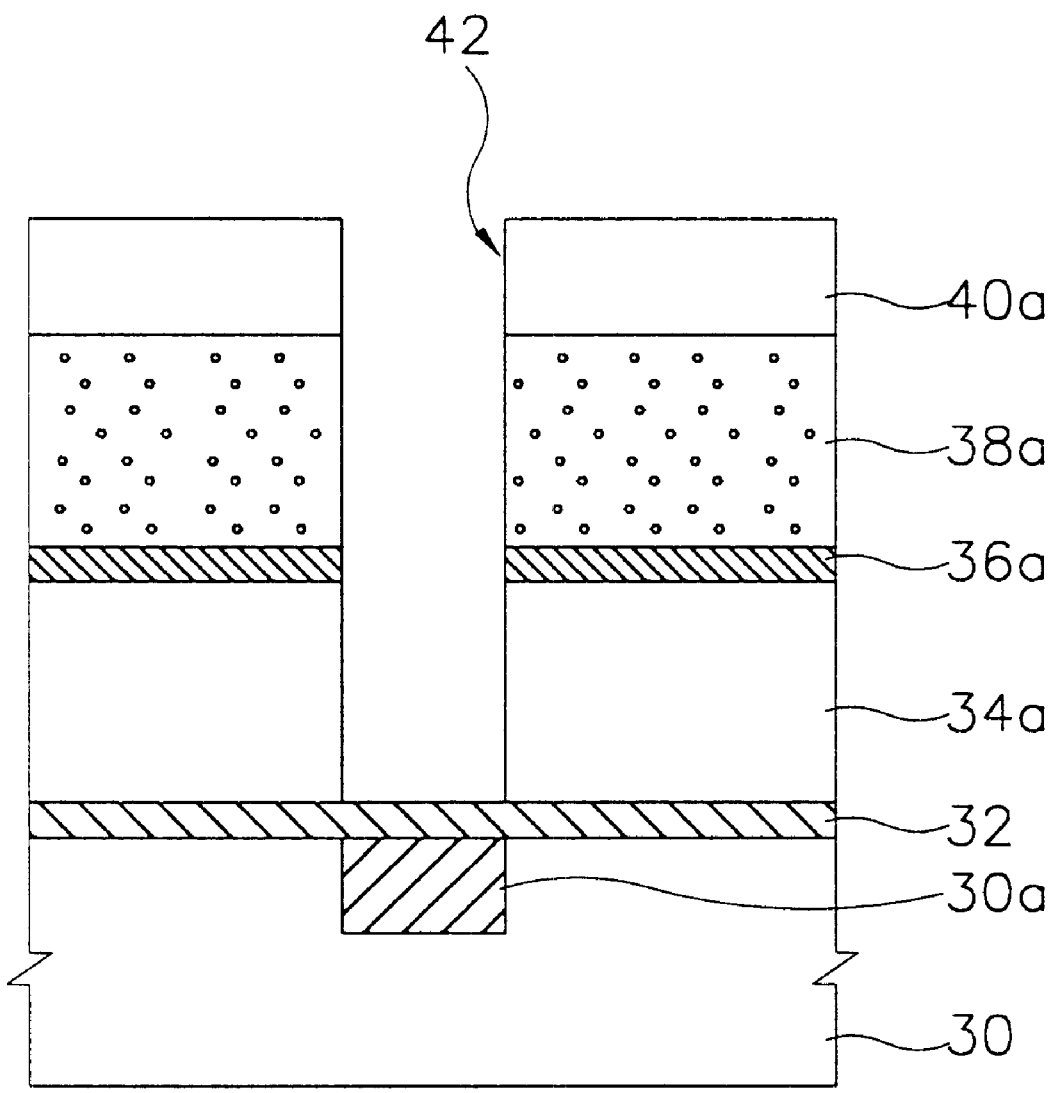

Referring to FIG. 2E, a via hole 42 is formed by continuously etching predetermined portions of the capping layer 40, now 40a, the third insulation layer 38, now 38a, the second etch stop layer 36, now 36a, and the second insulation layer 34, now 34a, in such a manner that a part of the etch stop layer 32 positioned on an upper portion of the conductive pattern 30a of the first insulation layer 30 is exposed.

Specifically, a first photoresist pattern (not shown) for defining a via hole portion is preferably formed on the capping layer 40a. The first photoresist pattern is positioned such that the first etch stop layer 32 positioned at the upper portion of the conductive pattern 30a is exposed after the etching process is carried out. Then, the capping layer 40a, the third insulation layer 38a, the second etch stop layer 36a and the second insulation layer 34a are sequentially etched using the first photoresist pattern as an etching mask, thereby forming the via hole 42 for exposing the etch stop layer 32 at a lower portion thereof. The first photoresist pattern is removed after forming the via hole 42.

Figure 2F:
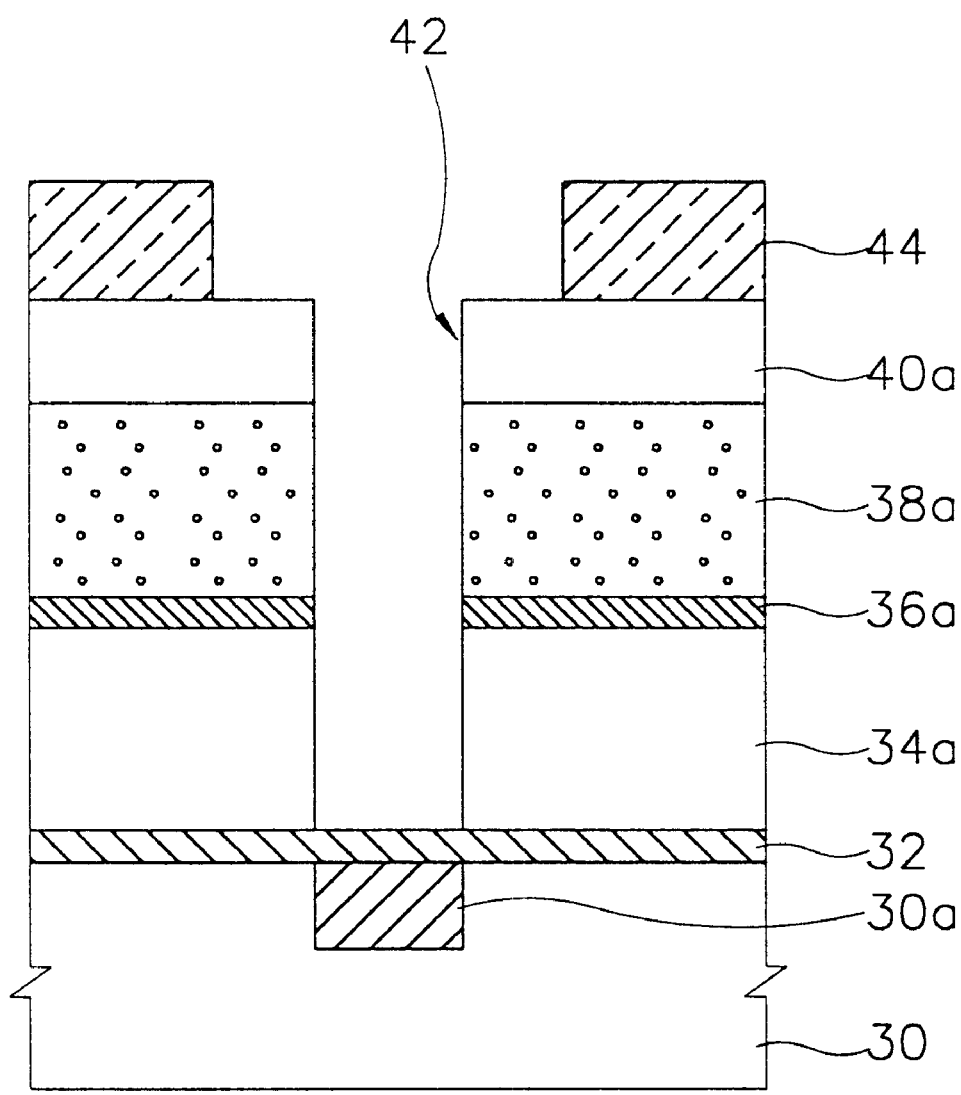

Referring to FIG. 2F, a second photoresist pattern 44 for defining a trench portion is formed on the capping layer 40a having the via hole 42. A linearly shaped opening is formed in the second photoresist pattern 44 and includes the via hole 42.

Figure 2G:
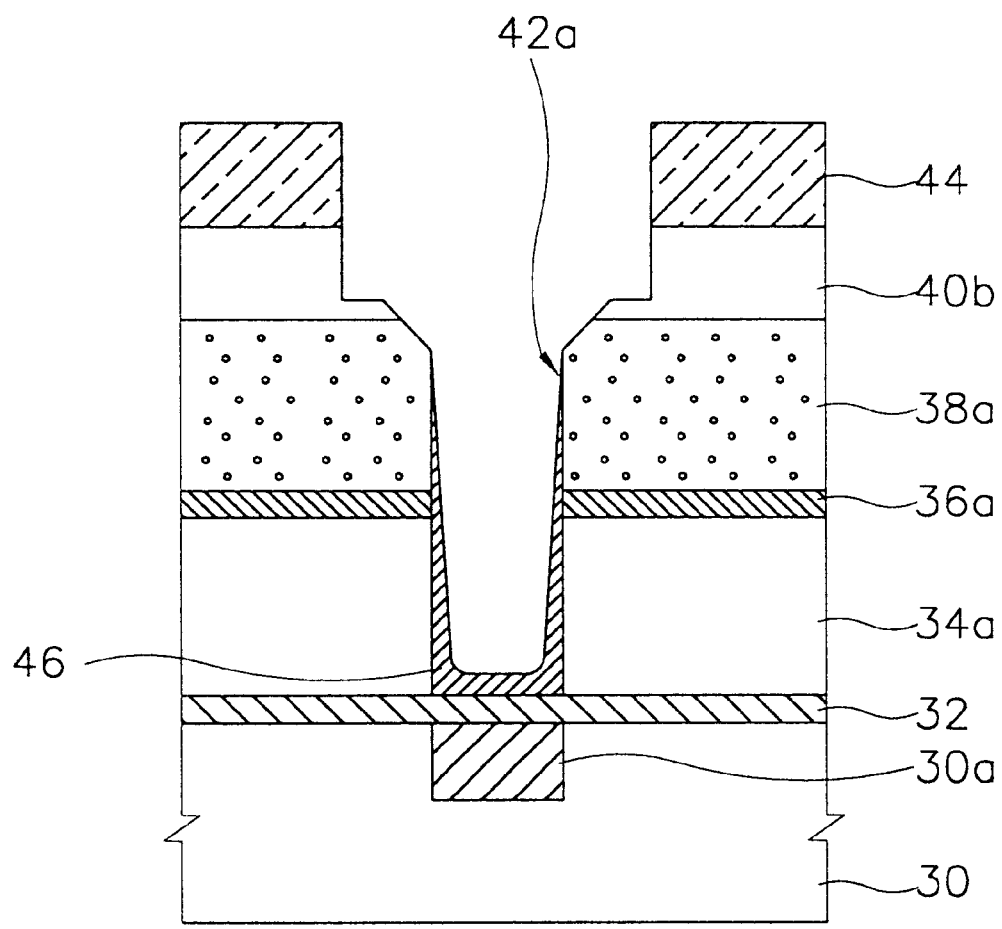

Referring to FIG. 2G, the capping layer 40b is partially etched using the second photoresist pattern 44 as an etching mask. The etching gas used for etching the capping layer 40b causes formation of a polymer layer 46 at a lower portion of the via hole 42. The polymer layer 46 is capable of protecting the first etch stop layer 32. At this time, some polymers are also formed at a side of the via hole 42, now 42a.

Specifically, an etching gas capable of etching the capping layer 40b is used to partially etch the capping layer 40b. Thus, the etching gas used will barely etch the first etch stop layer 32 exposed at the lower portion of the via hole 42a. That is, the oxide based capping layer 40b that does not include carbon or a carbon compound is reacted with the etching gas so that the capping layer 40b is etched. On the contrary, the non-oxide based first etch stop layer 32 that includes carbon or a carbon compound is reacted with the etching gas so that the polymer layer 46 for protecting the first etch stop layer 32 is formed. Therefore, when performing the process under the above conditions, the etching gas causes the formation of the polymer layer 46 for protecting the first etch stop layer 32 while stably etching the capping layer 40b.

An etching gas that satisfies the above conditions includes C$_x$F$_y$ gas, in which a ratio of fluorine to carbon is below about 3:1. Examples of the etching gas may include C$_2$F$_6$, C$_3$F$_8$, C$_4$F$_8$, C$_4$F$_6$, and C$_5$F$_8$ gas.

Also, oxygen, CO gas, or both may be added to the C$_x$F$_y$ gas. In addition, an inert gas such as argon (Ar) may be provided together with C$_x$F$_y$ gas.

When performing the etching process using the above-mentioned etching gas, the oxide based capping layer 40a, which is formed by the bonding of silicon (Si) and oxygen (O$_2$), is reacted with the etching gas so that the capping layer 40a is etched while generating by-product gases such as CFO, CO, CF$_2$O and SiF gases. However, the polymer layer 46 is formed on the non-oxide based first etch stop layer 32 that includes carbon or a carbon compound by a fluorine-carbon (F—C) bond or a carbon-carbon (C—C) bond.

When etching the capping layer 40a, the capping layer 40a is partially etched so that the capping layer 40b remains on the third insulation layer 38a. The reason being that if the capping layer 40b is entirely etched, the etching gas will be transferred to the third insulation layer 38a, which is a lower layer. Accordingly, the polymer layer is also formed on the oxide based third insulation layer 38a, which includes a low dielectric material, such as carbon or a carbon compound, due to the etching gas. Since the polymer layer is not easily etched, if the polymer layer is formed on the third insulation layer 38a, normal etching of the third insulation layer 38a is impeded. Accordingly, a process failure occurs.

It is preferable that when forming the capping layer 40b, the polymer layer 46 capable of protecting the first etch stop layer 32 is formed on the first etch stop layer 32 when partially etching the capping layer 40b. Also, it is preferable that the capping layer 40b has a predetermined thickness sufficient to allow all or part of the capping layer 40b to remain after a subsequent polishing process.

If the polymer layer 46 is insufficiently formed on the first etch stop layer 32 when etching the capping layer 40b, the first etch stop layer 32 may be etched when forming the trench. However, if the capping layer 40b is formed so thick as to sufficiently form the polymer layer 46, a thick portion of the capping layer 40b remains after the polishing process for forming the conductive lines has been carried out. A thick remaining portion of the capping layer 40b increases the capacitance of the parasitic capacitor because the dielectric constant of the capping layer 40b is higher than the dielectric constant of the third insulation layer. Accordingly, the initial thickness and etch thickness of the capping layer 40b are properly determined by considering the above matters.

Hereinafter, an exemplary process for partially etching the capping layer 40b will be described.

The capping layer 40b is formed on the third insulation layer to a thickness of 2000 Å. The capping layer 40b is etched off a thickness of 1500 Å using the second photoresist pattern 44 as an etching mask. Therefore, the capping layer 40b of region etching remain thickness of 500 Å. At this time, a mixed gas including about 10 to 20 sccm of $C_xF_y$ gas (where y/x is below 3), about 0 to 1000 sccm of argon gas, and about 0 to 10 sccm of oxygen gas is used as an etching gas under a pressure of about 5 to 50 mtorr. When the capping layer 40b has been etched under the above conditions, a polymer layer having a thickness of about 200 to 500 Å is formed on the first etch stop layer 32.

Figure 2H:
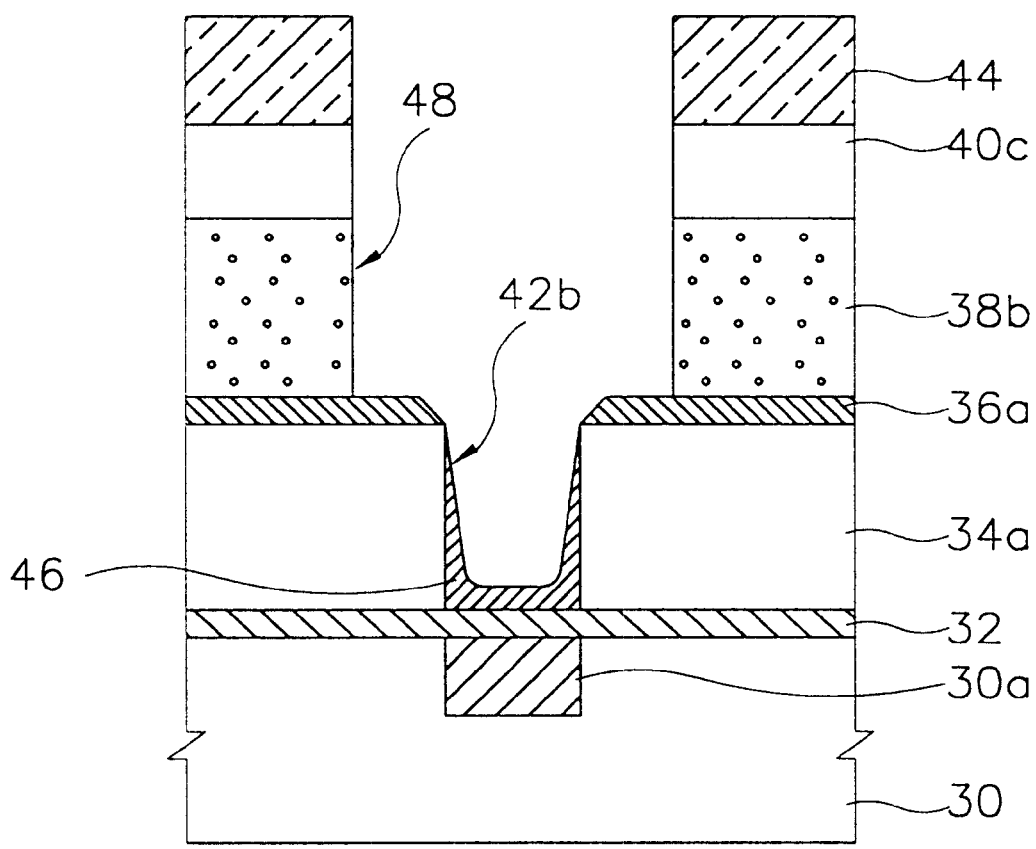
Figure 2I:
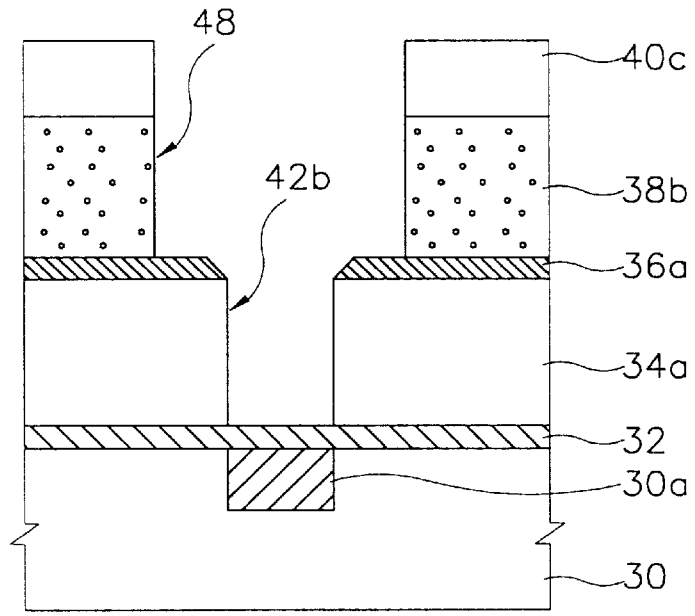

Referring to FIG. 2H, a trench 48 is formed by sequentially etching the remaining capping layer 40b, now 40c, and third insulation layer 38a, now 38b, until the second etch stop layer 36a is exposed using the second photoresist pattern 44 as an etching mask. The trench 48 is formed in a linear shape while overlapping the via hole 42a, now 42b. In the trench 48, a conductive line is formed through a subsequent process.

When forming the trench 48, etch conditions capable of minimizing waste of the polymer layer 46 that are formed on the first etch stop layer 32 for protecting the first etch stop layer 32, are adopted. That is, when the etching process is carried out, the etching rate of the remaining capping layer 40a and the third insulation layer 38b are determined to be lower than the etching rate of the polymer layer 46.

An etching gas that satisfies the above conditions includes $C_xF_y$ gas, in which a ratio of fluorine to carbon is below 3:1. Examples of such an etching gas include $C_2F_6$, $C_3F_8$, $C_4F_8$, $C_4F_6$, and $C_5F_8$ gas. It is also possible to add at least one of nitrogen, oxygen, and CO gases to the $C_xF_y$ gas. In addition, $CH_xF_y$ based gases may be added as well. The $CH_xF_y$ based gases may include $CH_2F_2$, $CH_3F$, or $CHF_3$ gas.

When partially etching the capping layer 40b, if oxygen gas is added to the etching gas when forming the trench 48, a flow rate of the oxygen gas is about 1.5 to 3 times a flow rate of oxygen gas added to the etching gas when partially etching the capping layer 40.

For example, in order to form the trench 48, a mixed gas including about 10 to 20 sccm of $C_xF_y$ gas (where y/x is below 3), about 0 to 1000 sccm of argon gas, about 0 to 20 sccm of oxygen gas, about 10 to 200 sccm of nitrogen gas or $N_2O$ gas, and about 0 to 10 sccm of $CH_xF_y$ gas is used as an etching gas under a pressure of about 10 to 100 mTorr.

When the trench 48 is formed under the conditions described above, the first etch stop layer 32 may be protected by the polymer layer 46. Thus, damage to the upper portion of the conductive pattern 30a caused when high-energy ions collide with a lower portion of the conductive pattern 30a during the etching process may be prevented. Accordingly, a borderless contact having a low resistance may be achieved.

Referring to FIG. 21, the second photoresist pattern 44, which is used as the etching mask when forming the trench 48, is removed through an ashing process using plasma. At this time, the polymer layer 46 exposed at the lower portion of the via hole 42b is also removed by plasma.

Figure 2J:
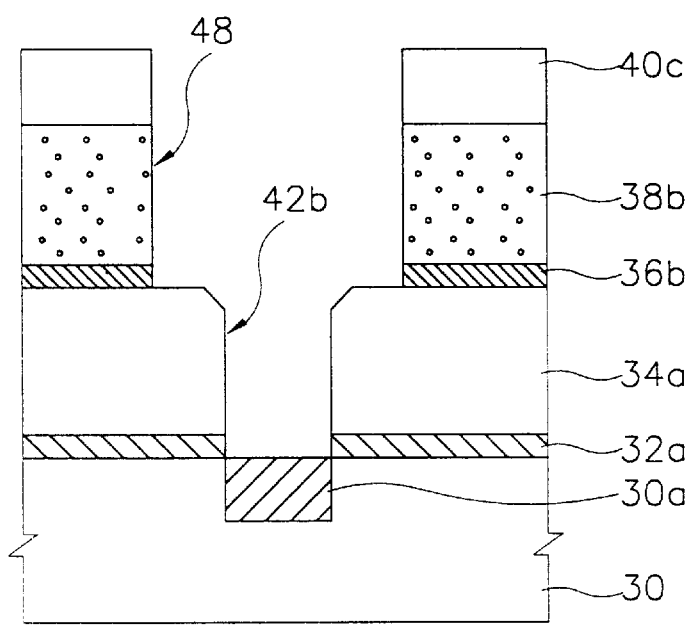

Referring to FIG. 2J, the upper surface of the conductive pattern 30a is exposed by etching the first etch stop layer 32a exposed at the lower portion of the via hole 42b. At this time, the second etch stop layer 36, now 36b, exposed at the lower portion of the trench 48 is also etched. Accordingly, the dual damascene structure capable of simultaneously forming the conductive line and the contact may be achieved.

Figure 2K:
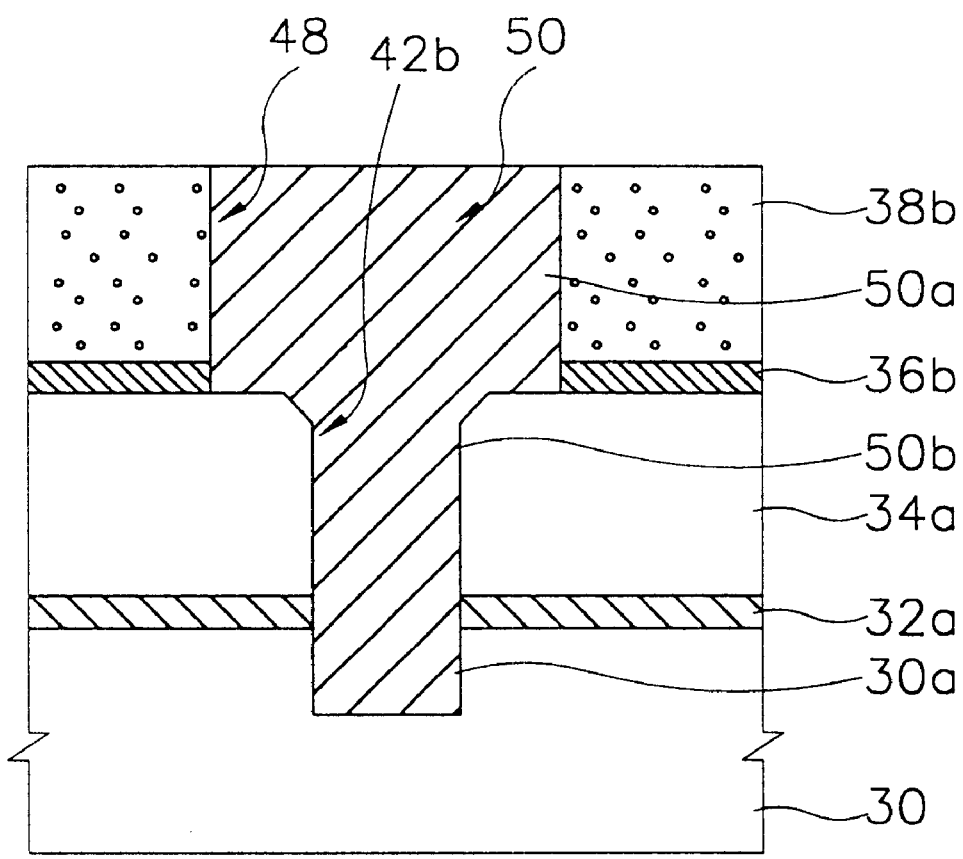

Referring to FIG. 2K, a conductive material 50 is deposited while filling the via hole 42b and the trench 48. Then, the conductive material 50 is polished so that the electric wiring for exposing the third insulation layer 38b and a conductive line 50a at an upper surface of the conductive material 50 is formed.

More particularly, the conductive material filling the trench 48 forms the conductive line 50a, and conductive material filling the via hole 42b, which extends downward from a predetermined portion of the trench 48, acts as a contact 50b for connecting the conductive line 50a to the lower conductive pattern 30a. Accordingly, the conductive line 50a and the contact 50b are simultaneously formed.

The conductive material 50 preferably has a low resistance with superior electromigration characteristics. For example, copper may be used as the conductive material 50.

While polishing the conductive material 50, as shown in the figures, the capping layer 40c remaining on the third insulation layer 38b is entirely polished in order to form the electric wiring exposing the third insulation layer 38b. When the capping layer 40c is completely removed, the conductive lines 50a are insulated from each other by the third insulation layer 38b including a low dielectric material, so that the capacitance between the conductive lines 50 may be reduced.

According to another embodiment of the present invention that is not illustrated in the figures, a part of the capping layer 40 may remain after completion of the polishing process. In this embodiment, the remaining capping layer 40c has a thickness in a range of about 50 to 200 Å so as to prevent the third insulation layer 38b and the conductive line 50a from being damaged due to over-polishing.

However, it is preferable to adjust the initial thickness and etching thickness of the capping layer 40c and the polishing conditions such that the third insulation layer 38b and the conductive line 50 are not damaged, even if the capping layer 40c is entirely removed by the polishing process.

As described above, in the etching process for forming a dual damascene structure to form electric wiring according to the present invention, damage to the lower conductive pattern may be prevented.

Therefore, contact resistance between the conductive material filling the via hole and the conductive pattern may be reduced.

According to the present invention, in which electric wiring is formed through the dual damascene process, the capping layer is formed on the third insulation layer, which is provided to insulate conductive lines from each other. Then, the capping layer is partially etched so that the polymer layer is formed on the first etch stop layer positioned at the lower portion of the via hole. The trench for forming the conductive line is formed only after the polymer layer has been formed on the first etch stop layer, as described above. Accordingly, when the trench is formed by etching the remaining capping layer and the third insulation layer, the first etch stop layer is protected by the polymer layer, which may prevent etching of the first etch stop layer exposed at the lower portion of the via hole. Accordingly, damage of the lower conductive pattern positioned below the bottom of the first etch stop layer may be prevented. In addition, when the contact is formed by removing the first etch stop layer, the contact resistance may be reduced, thereby improving various characteristic of the semiconductor device including the response time.

The present invention has been described in detail with reference to preferred embodiments thereof, and although specific terms are employed, they are used and are to be interpreted in a generic and a descriptive sense only and not for purpose of limitation. Accordingly, it will be understood to those of ordinary skill in the art that various changes, substitutions and alterations in form and details may be made without departing from the spirit and scope of the present invention as set forth in the following claims.

What is claimed is:

1. A method of forming a wiring of a semiconductor device, comprising:

forming a first insulation layer having a hole or a first trench filled with a conductive material on a semiconductor substrate;

sequentially forming a first etch stop layer including a non-oxide based insulating material having carbon or a carbon compound and a second insulation layer including an oxide based insulating material on the first insulation layer;

forming a third insulation layer including the oxide based insulating material on the second insulation layer;

forming a capping layer including a non-carbonic oxide based insulating material on the third insulation layer;

forming a via hole by etching predetermined portions of the capping layer, the third insulation layer and the second insulation layer in such a manner that a part of the first etch stop layer corresponding to an upper portion of the hole or the first trench filled with conductive material is exposed;

forming a photoresist pattern on the capping layer having the via hole so as to form a linear trench including the via hole;

partially etching the capping layer using the photoresist pattern as an etching mask, the capping layer being reacted with an etching gas used for etching the capping layer to form a polymer layer on the first etch stop layer for protecting the first etch stop layer;

forming a second trench by sequentially etching the remaining capping layer and the third insulation layer using the photoresist pattern as an etching mask;

removing the photoresist pattern and the polymer layer;

removing the first etch stop layer exposed at a lower portion of the via hole; and filling a resulting structure with a conductive material.

2. The method as claimed in claim 1, wherein the third insulation layer includes an oxide based layer having a dielectric constant below about 3.5.

3. The method as claimed in claim 1, wherein the first etch stop layer includes an SiC layer.

4. The method as claimed in claim 1, wherein the third insulation layer is formed using carbon-doped or carbon compound-doped oxide, hydrogen silsesquioxane (HSQ), or methyl silsesquioxane (MSQ).

5. The method as claimed in claim 1, wherein the capping layer is an $SiO_2$ layer, a TEOS layer, a PEOX layer, an SiOF layer, or a BPSG layer.

6. The method as claimed in claim 1, wherein the etching gas used for etching the capping layer barely etches the first etch stop layer formed at the lower portion of the via hole.

7. The method as claimed in claim 6, wherein the etching gas used for etching the capping layer includes $C_xF_y$ gas, in which a ratio (y/x) of fluorine (F) to carbon (C) is below about 3:1.

8. The method as claimed in claim 7, wherein the etching gas used for etching the capping layer is any one selected from the group consisting of $C_2F_6$, $C_3F_8$, $C_4F_8$, $C_4F_6$, and $C_5F_8$ gases.

9. The method as claimed in claim 7, wherein the etching gas used for etching the capping layer further includes at least one selected from the group consisting of oxygen and CO gases.

10. The method as claimed in claim 1, wherein the etching gas used for forming the second trench includes $C_xF_y$ gas, in which a ratio (y/x) of fluorine (F) to carbon (C) is below about 3:1, and at least one selected from the group consisting of oxygen, CO, and nitrogen is added to the $C_xF_y$ gas.

11. The method as claimed in claim 10, wherein the $C_xF_y$ gas is any one selected from the group consisting of $C_2F_6$, $C_3F_8$, $C_4F_8$, $C_4F_6$, and $C_5F_8$ gases.

12. The method as claimed in claim 10, wherein, when forming the second trench, a flow rate of oxygen gas is 1.5 to 3 times as compared with a flow rate of oxygen gas used for partially etching the capping layer.

13. The method as claimed in claim 10, wherein the etching gas used for forming the second trench further includes $CH_xF_y$ based gas.

14. The method as claimed in claim 13, wherein the $CH_xF_y$ gas is any one selected from the group consisting of $CH_2F_2$, $CH_3F$, and $CHF_3$.

15. The method as claimed in claim 1, further comprising forming a second etch stop layer indicating an end point of etching when forming the second trench between the second insulation layer and the third insulation layer.

16. The method as claimed in claim 15, wherein the second etch stop layer includes an SiN layer or a non-oxide based layer including carbon or a carbon compound.

17. The method as claimed in claim 1, wherein the photoresist pattern and the polymer layer are simultaneously removed by performing an ashing process.

18. The method as claimed in claim 1, wherein the conductive material filling the second trench and the via hole includes copper.

19. The method as claimed in claim 1, wherein, after filling the resulting structure with a conductive material, a polishing process is carried out on an upper surface of the resulting structure to expose the third insulation layer and the conductive material filling the second trench.

20. The method as claimed in claim 1, wherein, after filling the resulting structure with the conductive material, a polishing process is carried out to expose the capping layer and the conductive material filling the second trench to an upper surface of the resulting structure.

21. The method as claimed in claim 1, wherein the third insulation layer is comprised of SiOC, SiOH, or $SiOCH_3$ based material.

22. The method as claimed in claim 7, wherein the etching gas used for etching the capping layer further includes an inert gas.

23. The method as claimed in claim 22, wherein the inert gas is comprised of argon (Ar).

\* \* \* \* \*